United States Patent
Kim et al.

(10) Patent No.: US 6,962,855 B2
(45) Date of Patent: Nov. 8, 2005

(54) METHOD OF FORMING A POROUS MATERIAL LAYER IN A SEMICONDUCTOR DEVICE

(75) Inventors: Jin-Sung Kim, Suwon (KR); Young-Nam Kim, Suwon (KR); Hyun-Dam Jeong, Suwon (KR); Sun-Young Lee, Suwon (KR)

(73) Assignee: Samsung Electronics Co., Ltd., Suwon-si (KR)

(*) Notice: Subject to any disclaimer, the term of this patent is extended or adjusted under 35 U.S.C. 154(b) by 84 days.

(21) Appl. No.: 10/697,053

(22) Filed: Oct. 31, 2003

(65) Prior Publication Data

US 2005/0118782 A1 Jun. 2, 2005

(30) Foreign Application Priority Data

Nov. 8, 2002 (KR) .................... 10-2002-0069262

(51) Int. Cl.[7] .............................................. H01L 21/76
(52) U.S. Cl. .................. 438/409; 438/423; 438/477; 438/530; 438/778; 438/783; 438/960; 257/E21.275
(58) Field of Search ................................. 438/409, 423, 438/477, 530, 778, 783; 257/E21.275

(56) References Cited

U.S. PATENT DOCUMENTS

| | | | |
|---|---|---|---|
| 5,626,679 A | * | 5/1997 | Shimizu et al. ...... 118/723 MR |
| 6,451,712 B1 | | 9/2002 | Dalton et al. |
| 6,541,367 B1 | * | 4/2003 | Mandal ...................... 438/622 |

FOREIGN PATENT DOCUMENTS

| | | | | |
|---|---|---|---|---|
| JP | 58006138 A | * | 1/1983 | ......... H01L/21/316 |
| JP | 62018040 A | * | 1/1987 | ......... H01L/21/316 |

OTHER PUBLICATIONS

Mayumi et al., PSG Glow in High–Pressure Steam, Japanesee Journal of Applied Physics, vol. 29, No. 4, Apr. 1990, pp645–649.*

* cited by examiner

Primary Examiner—George Fourson
Assistant Examiner—Thanh V. Pham
(74) Attorney, Agent, or Firm—Volentine Francos & Whitt, PLLC (57) ABSTRACT

A material layer containing impurities that react with water molecules is formed on a substrate. The material layer is then heated under a pressure exceeding one atmosphere and in the presence of water vapor to generate pores in the material layer. The material layer may form the interlayer insulating layer of a semiconductor device.

20 Claims, 7 Drawing Sheets

METHOD OF FORMING A POROUS MATERIAL LAYER IN A SEMICONDUCTOR DEVICE

BACKGROUND OF THE INVENTION

1. Field of the Invention

The present invention relates to a method of fabricating a semiconductor device and, more particularly, to a method of forming a porous material layer in a semiconductor device.

A claim of priority is made to Korean Patent Application No. 2002-69262, filed on Nov. 8, 2002, the contents of which are incorporated herein by reference in their entirety.

2. Description of Related Art

As semiconductor devices become more highly integrated, the distances between adjacent interconnection lines have been reduced. Generally, an interlayer insulating layer occupies the region between the interconnection lines, and the dielectric constant (k) of the interlayer insulating layer creates a capacitive effect which delays the propagation of electrical signals applied to the interconnection lines. Accordingly, to improve the operating speed of the semiconductor device, it is desirable to form the interlayer insulating layer of a material having a low dielectric constant.

Silicon oxide has been typically employed as the material of the interlayer insulating layer. Unfortunately, however, silicon oxide has a dielectric constant of 3.9, which is generally too high to improve operating speeds in highly integrated devices.

One known method of reducing the dielectric constant of the interlayer insulating layer is to form the layer of a porous material. The pores or voids in the porous material decrease the dielectric constant of the layer as a whole. One drawback with the use of porous layers, however, is that the pores of the layer can cause over-etching when the porous layer is patterned, particularly when the layer contains carbon or carbon residues. For example, in the event that a porous material layer containing carbon residues is patterned to form via holes, the via holes may exhibit abnormal profiles.

In an effort to overcome the problem of over-etching, U.S. Pat. No. 6,451,712 to Dalton et al., entitled "Method For Forming A Porous Dielectric Material Layer In A Semiconductor Device And Device Formed", describes a method of forming a low-k porous dielectric layer. The method of this patent is characterized in that a dense insulating layer is patterned using an etching technique, such as by reactive ion etching (RIE), prior to formation of pores in the dense insulating layer. Since the etching process precedes the formation of the pores in the dense insulating layer, over-etching that is otherwise caused by the pores can be prevented when patterning the insulating layer. However, the process of forming the via holes is typically performed using a photoresist pattern as an etching mask. Thus, the photoresist pattern must be removed using an ashing process after forming the via holes and prior to formation of the pores in the layer. Unfortunately, the ashing process can adversely increase deformation of the sidewall profiles of the via holes.

SUMMARY OF THE INVENTION

The present invention is directed to methods of forming a porous material layer and methods of fabricating a semiconductor device having a porous material layer.

According to one aspect of the invention, the invention provides a method of forming a porous material layer in which a material layer containing impurities is formed on a substrate and the substrate is heated under pressure exceeding 1 atmosphere and in the presence of water vapor to generate pores in the material layer. The pores are generated from a chemically reaction between the impurities and water ($H_2O$) molecules, and from the subsequent ejection of the impurities from the material layer. The pressure exceeding 1 atmosphere promotes reaction of the impurities and the water molecules.

The material layer may be an insulating layer, and preferably, the material layer is a BPSG (borophosphosilicate glass) layer, a BSG (borosilicate glass) layer or a PSG (phosphosilicate glass) layer. The impurities may boron atoms and/or phosphorus atoms. The substrate is preferably heated to a temperature of 85 degrees Celsius to 150 degrees Celsius. Also, it is preferable that the water vapor has a humidity of 85% to 100% and the pressure is 2 atmospheric pressures to 5 atmospheric pressures. Under these conditions, the water molecules in the water vapor are easily injected into the material layer.

Further, the insulating layer may be formed of a BPSG layer containing fluorine atoms or a BSG layer containing fluorine atoms. In this case, boron atoms in the BPSG layer or the BSG layer react on the water molecules as well as the fluorine atoms. Accordingly, the fluorine atoms accelerate the ejection of the boron atoms. As a result, the pores can be generated to a greater extent in the insulating layer.

The present invention may further include baking the substrate after generating the pores to remove any water contained in the layer. The baking of the substrate is preferably performed using a hydrogen gas and a nitrogen gas as ambient gases at a temperature of 350 degrees Celsius to 400 degrees Celsius.

Also, the present invention may further include irradiating the substrate with ultraviolet rays to further remove any silanol groups (Si—OH bonds) in the material layer. This can further reduce the dielectric constant of the material layer.

According to another aspect of the invention, the invention provides a method of fabricating a semiconductor device having a porous material layer. This method includes forming an interlayer insulating layer containing impurities on a semiconductor substrate. The impurities are reactive with water molecules. The substrate having the interlayer insulating layer is loaded into a chamber. Water vapor is introduced in the chamber, and the chamber pressure is increased to a higher pressure than 1 atmospheric pressure. Also, the substrate in the chamber is heated. As a result, pores are generated in the interlayer insulating layer. The semiconductor substrate having the pores is baked to remove water exiting in the insulating layer. The baking process is performed using a hydrogen gas and a nitrogen gas as ambient gases. Metal interconnection lines are then formed using a dual damascene technique in the interlayer insulating layer where the water is removed.

The interlayer insulating layer may be a BPSG (borophosphosilicate glass) layer, a BSG (borosilicate glass) layer or a PSG (phosphosilicate glass) layer. In this case, the impurities are boron atoms and/or phosphorus atoms.

It is preferable that the water vapor has a humidity of 85% to 100% and the pressure in the chamber is 2 atmospheric pressures to 5 atmospheric pressures. Also, the substrate in the chamber is preferably heated to a temperature of 85 degrees Celsius to 150 degrees Celsius. Under these conditions, water molecules in the water vapor are easily injected into the interlayer insulating layer. The impurities in the interlayer insulating layer react with the water molecules introduced into the interlayer insulating layer, and the impurities are ejected outside of the interlayer insulating layer. In this manner, pores are generated in the interlayer insulating layer.

In addition, ultraviolet rays may be irradiated onto the substrate prior to formation of the metal interconnection lines. As a result, silanol groups (Si—OH bonds) existing in the interlayer insulating layer are removed, which can reduce the dielectric constant of the interlayer insulating layer.

The metal interconnection lines are preferably formed of a metal layer having a low resistivity and a high melting point. For example, the metal interconnection lines may be formed of a copper layer.

BRIEF DESCRIPTION OF THE DRAWINGS

Other features and advantages of the present invention will become readily apparent from the detailed description that follows, with reference to the accompanying drawings, in which.

DETAIL DESCRIPTION OF THE PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout the specification and drawings.

Figure 1:
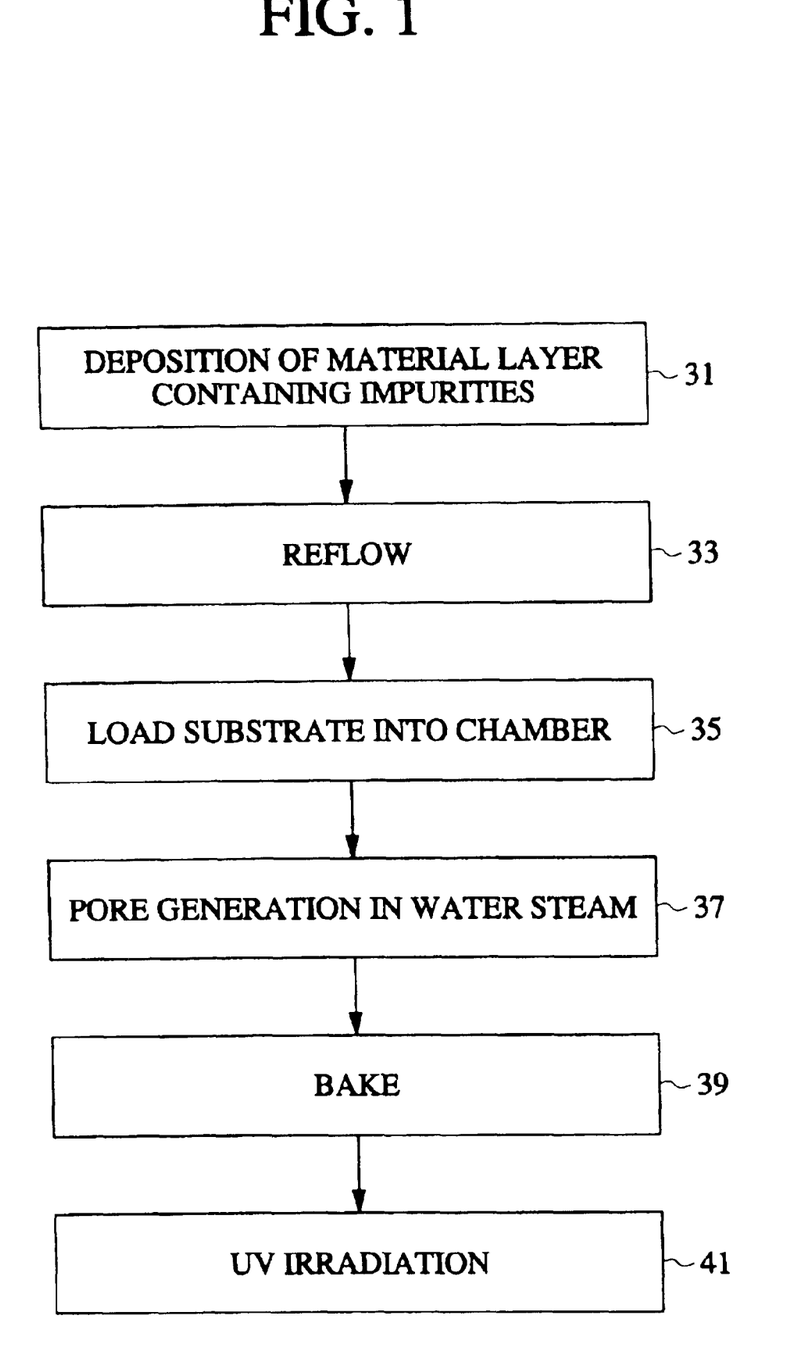
FIG. 1 is a process flow chart for illustrating a method of forming a porous material layer according to a first embodiment of the invention.

FIG. 1 is a process flow chart for illustrating a method of forming a material layer according to a first embodiment of the invention.

Referring to FIG. 1, a material layer containing impurities is deposited on a substrate (step 31). Preferably, the impurities are chemical elements that easily react with water molecules. For example, the impurities may be boron atoms and/or phosphorus atoms. A BPSG layer, a BSG layer or a PSG layer may be an attractive candidate as the material layer containing the impurities. The BPSG layer, the BSG layer or the PSG layer may be deposited using a conventional APCVD (atmospheric pressure chemical vapor deposition) technique at a temperature of 350 degrees Celsius to 500 degrees Celsius.

For example, the deposition process of a BPSG layer may be performed using a silane ($SiH_4$) gas, a diborane ($B_2H_6$) gas, a phosphine ($PH_3$) gas and an oxygen gas as process gases. Here, the diborane ($B_2H_6$) gas and the phosphine ($PH_3$) gas act as dopant gases. Thus, the BPSG layer is deposited by the following chemical formula 1.

$$SiH_4+O_2+B_2H_6+PH_3 \rightarrow SiO_2+P_2O_5+B_2O_3+H_2 \qquad \text{(formula 1)}$$

The hydrogen gas is exhausted outside of a furnace of the APCVD apparatus. As a result, the BPSG layer consists of $SiO_2$, $P_2O_5$ and $B_2O_3$.

As another example, the deposition process of a BSG layer may be performed using a silane ($SiH_4$) gas, a diborane ($B_2H_6$) gas and an oxygen gas as process gases. Here, the diborane ($B_2H_6$) gas acts as a dopant gas. Thus, the BSG layer is deposited by the following chemical formula 2.

$$SiH_4+O_2+B_2H_6 \rightarrow SiO_2+B_2O_3+H_2 \qquad \text{(formula 2)}$$

As a result, the BSG layer consists of $SiO_2$ and $B_2O_3$.

As yet another example, the deposition process of a PSG layer may be performed using a silane ($SiH_4$) gas, a phosphine ($PH_3$) gas and an oxygen gas as process gases. Here, the phosphine ($PH_3$) gas acts as a dopant gas. Thus, the PSG layer is deposited by the following chemical formula 3.

$$SiH_4+O_2+PH_3 \rightarrow SiO_2+P_2O_5+H_2 \qquad \text{(formula 3)}$$

As a result, the PSG layer consists of $SiO_2$ and $P_2O_5$.

The BPSG layer, the BSG layer and the PSG layer described above are inorganic silicon oxide insulating layers, i.e., silicon oxide layers which do not include carbon.

Subsequently, the inorganic insulating layer containing the impurities is reflowed to form a planarized insulating layer having a dense film quality (step 33). The reflow process is typically performed at a temperature of 800 degrees Celsius to 900 degrees Celsius.

The substrate having the planarized insulating layer is loaded into another chamber (step 35). Water vapor (steam) is then introduced in the other chamber, and the pressure in the other chamber is increased so as to exceed 1 atmospheric pressure. In addition, the substrate is heated to a predetermined temperature. Alternatively, the temperature inside the other chamber can be increased instead of heating the substrate. It is preferable that the water vapor in the other chamber has a humidity of 85% to 100% and the pressure in the other chamber is within the range of 2 atmospheric pressures to 5 atmospheric pressures. Also, the temperature inside the other chamber or the temperature of the substrate is preferably within the range of 85 degrees Celsius to 150 degrees Celsius. Under this circumstance, water molecules in the water vapor are easily injected into the insulating layer, and the impurities in the insulating layer react on the water molecules injected into the insulating layer. As a result, the impurities are ejected from the insulating layer into the water vapor. Accordingly, a plurality of pores or voids are created in the insulating layer due to the ejection of impurities (step 37).

In the event that the insulating layer is a BPSG layer, the impurities, i.e., boron atoms and/or phosphorus atoms react with the water molecules according to the following chemical formulas 4 and 5 respectively.

$$B_2O_3 + H_2O \rightarrow H_3BO_3 \text{ (soluble)} \quad \text{(formula 4)}$$

$$P_2O_5 + H_2O \rightarrow H_3PO_4 \text{ (soluble)} \quad \text{(formula 5)}$$

As can be seen in the chemical formulas 4 and 5, the boron atoms and the phosphorus atoms react on the water molecules and are ejected from the BPSG layer into the water vapor.

In the event that the insulating layer is a BSG layer, boron atoms in the BSG layer react with the water molecules according to the chemical formula 4. Therefore, the boron atoms in the BSG layer are ejected from the BSG layer. Also, in the event that the insulating layer is a PSG layer, phosphorus atoms in the PSG layer react with the water molecules according to the chemical formula 5. Thus, the phosphorus atoms in the PSG layer are ejected from the PSG layer.

In the meantime, the insulating layer may be formed of a BPSG layer containing fluorine atoms (i.e., a BPFSG layer) or a BSG layer containing fluorine atoms (i.e., a BFSG layer). The fluorinated BPSG layer or the fluorinated BSG layer can be deposited by adding a gas containing fluorine atoms, for example, a $BF_3$ gas during the deposition process. The boron atoms in the fluorinated insulating layers react with the fluorine atoms therein according to the following chemical formula 6, during the step of generating the pores.

$$B_2O_3 + F \rightarrow BF_3 \text{ (gas)} \quad \text{(formula 6)}$$

Thus, the boron atoms in the fluorinated insulating layers react with the fluorine atoms as well as the water molecules. In other words, the fluorine atoms accelerate ejection of the boron atoms. As a result, the pores may be generated to a greater extent in the insulating layer.

Silanol group (Si—OH bonds) and water may exist in the insulating layer having the pores. The water and the silanol group may affect the dielectric constant of the insulating layer. Accordingly, it is preferable that the insulating layer having the pores is baked to remove the water therein (step 39). The baking process is preferably performed using a hydrogen gas and a nitrogen gas as ambient gases at a temperature of 350 degrees Celsius to 400 degrees Celsius.

Even though the baking process is performed, the silanol groups may still exist. Thus, it is preferable that ultraviolet rays be irradiated onto the substrate (step 41) to remove any silanol groups existing after the baking process. The ultraviolet rays have sufficient energy to break the Si—OH bonds.

According to the first embodiment as described above, the impurities in the inorganic insulating layer react with the water molecules and the impurities are ejected from the inorganic insulating layer. Thus, an inorganic porous insulating layer is formed. The porous insulating layer according to the first embodiment of the invention does not contain any carbon residue.

FIGS. 2 to 5 are cross sectional views for illustrating a method of fabricating a semiconductor device according to a second embodiment of the invention. This embodiment provides a method of fabricating a semiconductor device using the method of forming a porous layer according to the first embodiment.

Figure 2:
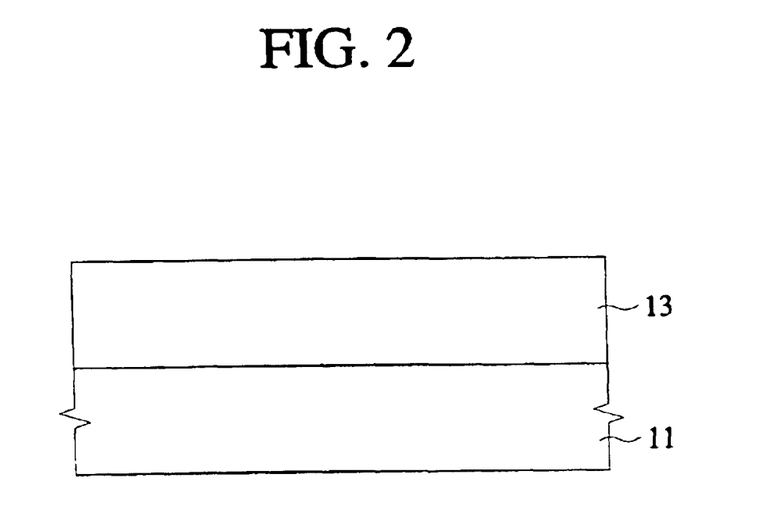
FIGS. 2 to 5 are cross sectional views for illustrating a method of fabricating a semiconductor device according to a second embodiment of the invention.

Referring to FIG. 2, an interlayer insulating layer 13, e.g., an inter-metal dielectric layer is formed on a semiconductor substrate 11. Preferably, the interlayer insulating layer 13 contains impurities that react with water molecules. For example, the interlayer insulating layer 13 may be formed of the same material layer as the insulating layer described in the first embodiment.

Figure 3:
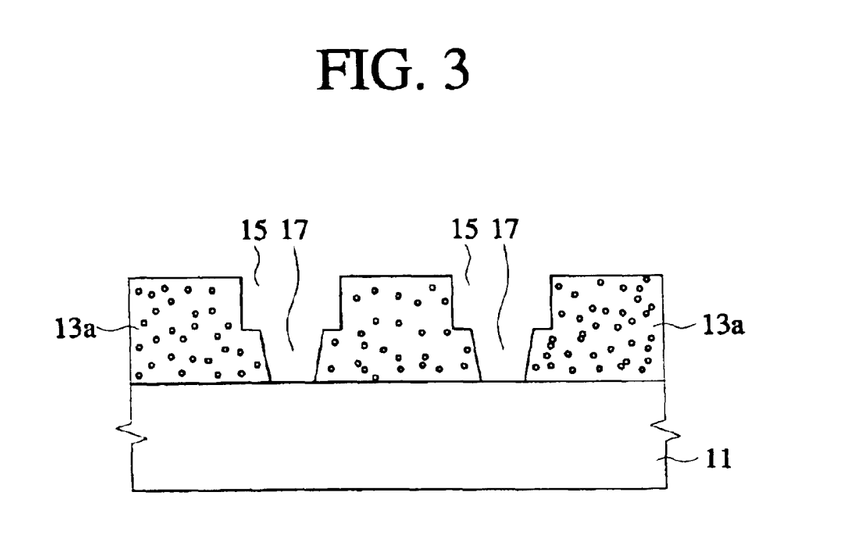

Referring to FIG. 3, the interlayer insulating layer 13 is treated in the same manner as the first embodiment to generate a plurality of pores in the interlayer insulating layer 13. Thus, the interlayer insulating layer 13 is converted into a porous interlayer insulating layer 13a. The porous interlayer insulating layer 13a is patterned with an etching process used in a conventional dual damascene technique, thereby forming interconnection grooves 15 and via holes 17. The etching process for forming the interconnection grooves 15 and the via holes 17 is performed using a photoresist pattern (not shown) as an etching mask. The photoresist pattern is removed using an ashing process that employs oxygen plasma, after forming the interconnection grooves 15 and the via holes 17. In this case, even though the porous interlayer insulating layer 13a (i.e., sidewalls of the interconnection grooves 15 and the via holes 17) is exposed to the oxygen plasma, the porous interlayer insulating layer 13a is not damaged or deformed by the oxygen plasma. This is because the porous interlayer insulating layer 13a does not contain any carbon residue therein. As a result, deformation of the sidewall profiles of the interconnection grooves 15 and the via holes 17 can be prevented.

Figure 4:
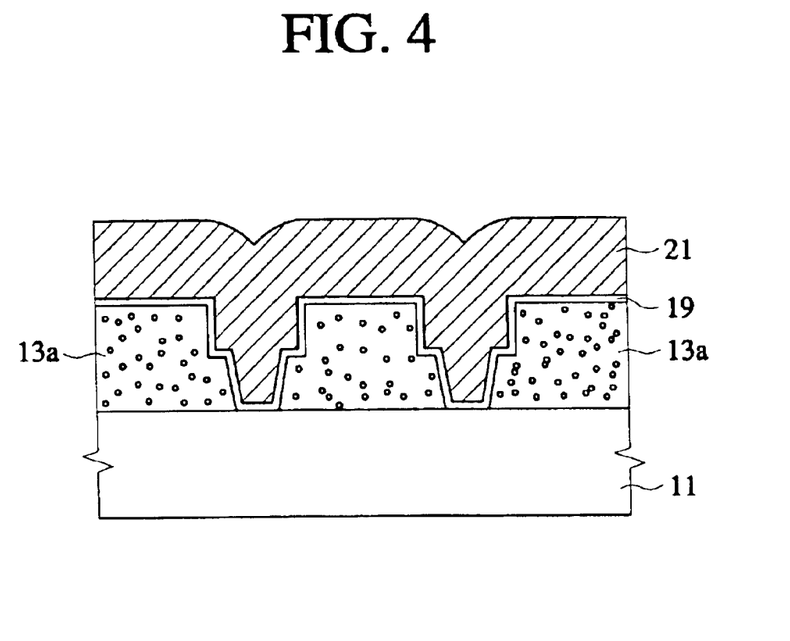

Referring to FIG. 4, a conductive layer 21 such as a metal layer is formed on an entire surface of the substrate having the interconnection grooves 15 and the via holes 17. The metal layer 21 may be formed of a copper layer having a low resistivity and a high melting point. A conformal diffusion barrier layer 19 is preferably formed on the substrate prior to formation of the interconnection grooves 15 and the via holes 17. The diffusion barrier layer 19 may be formed of a metal nitride layer such as a titanium nitride layer or a tantalum nitride layer. In the event that the metal layer 21 is formed of the copper layer, diffusion barrier layer 19 can prevent copper atoms in the copper layer from being diffused into the porous interlayer insulating layer 13a.

Figure 5:
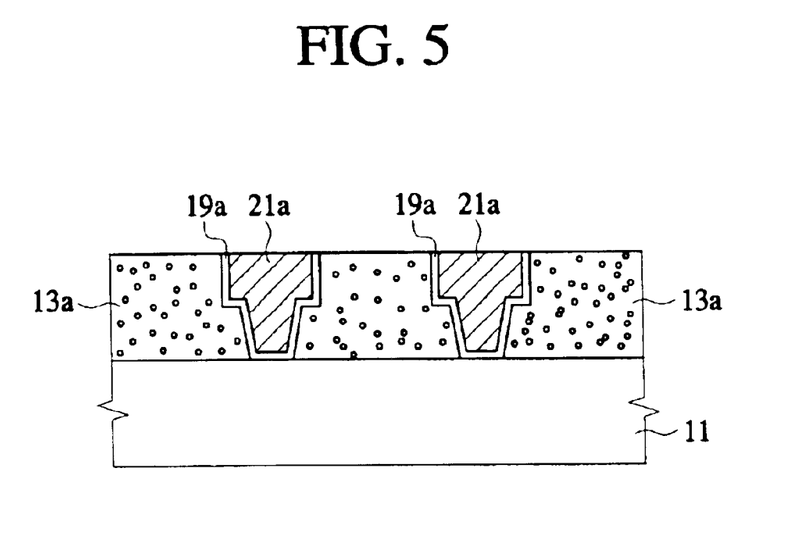

Referring to FIG. 5, the conductive layer 21 and the diffusion barrier layer 19 are planarized until a top surface of the porous interlayer insulating layer 13a is exposed. As a result, metal interconnection lines 21a are formed in the interconnection grooves 15, and diffusion barrier layer patterns 19a are formed to surround sidewalls and bottom surfaces of the metal interconnection lines 21a. The metal interconnection lines 21a are electrically connected to the semiconductor substrate 11 through the via holes 17.

According to the second embodiment as described above, the porous interlayer insulating layer 13a is formed in gap regions between the adjacent metal interconnection lines 21a. Thus, it is possible to substantially reduce parasitic capacitance between the metal interconnection lines 21a. Also, the porous interlayer insulating layer 13a is not damaged or deformed during the etching process for patterning the porous interlayer insulating layer 13a and the ashing process for removing the photoresist pattern, since the porous interlayer insulating layer 13a is an inorganic insulating layer. Accordingly, deformation of the sidewall profiles of the interconnection grooves 15 and the via holes 17 is prevented. As a result, a reliable porous insulating layer having excellent thermal immunity, excellent etching immunity and a low dielectric constant can be formed.

EXAMPLES

Samples were fabricated as described below in order to measure characteristics of various porous BPSG layers according to the aforementioned embodiments.

First, the BPSG layers having various impurity concentrations were formed on several semiconductor substrates. In detail, the BPSG layers were formed to have boron concentrations of 2.98 wt % to 5.54 wt % and phosphorus concentrations of 2.67 wt % to 8.7 wt %. The substrates having the BPSG layers were then loaded into a chamber. The semiconductor substrates in the chamber were cured for two hours in order to introduce water into the BPSG layers. The curing process was performed under a humidity of 100%, a pressure of 2 atmospheres and a temperature of 121 degrees Celsius. The semiconductor substrates were then unloaded from the chamber.

Amounts of the water in the cured BPSG layers were found using a FTIR (Fourier Transform Infra-Red) spectroscopy. That is to say, the amounts of the water in the cured BPSG layers were indirectly evaluated using optical absorbance to the Si—OH bonds. These measurement results are summarized in the following Table 1.

TABLE 1

| sample No. | Boron concentration (wt %) | Phosphorus concentration (wt %) | Optical absorbance to the Si—OH bonds |
|---|---|---|---|
| 1 | 2.98 | 8.26 | 0.31 |
| 2 | 3.39 | 6.33 | 0.72 |
| 3 | 4.24 | 8.44 | 0.88 |
| 4 | 3.57 | 4.76 | 1.39 |
| 5 | 4.46 | 6.5 | 2.05 |
| 6 | 4.5 | 4.78 | 2.58 |
| 7 | 3.61 | 2.67 | 2.67 |
| 8 | 4.62 | 3.33 | 3.12 |
| 9 | 5.2 | 3.9 | 4.44 |
| 10 | 5.4 | 5.1 | 7.06 |
| 11 | 5.54 | 3.5 | 7.07 |
| 12 | 5.2 | 6.03 | 7.37 |

As can be seen in the table 1, the amounts of the water injected into the cured BPSG layers are proportional to the boron concentration rather than the phosphorus concentration. That is, an increase of the boron concentration resulted in an increase of the water absorbance of the BPSG layer, whereas an increase of the phosphorus concentration resulted in a reduction of the water absorbance of the BPSG layer. As a result, in order to increase the number of pores in the cured BPSG layer, the boron concentration should be higher than 3 wt % and the phosphorus concentration should be lower than 6 wt %.

Figure 6:
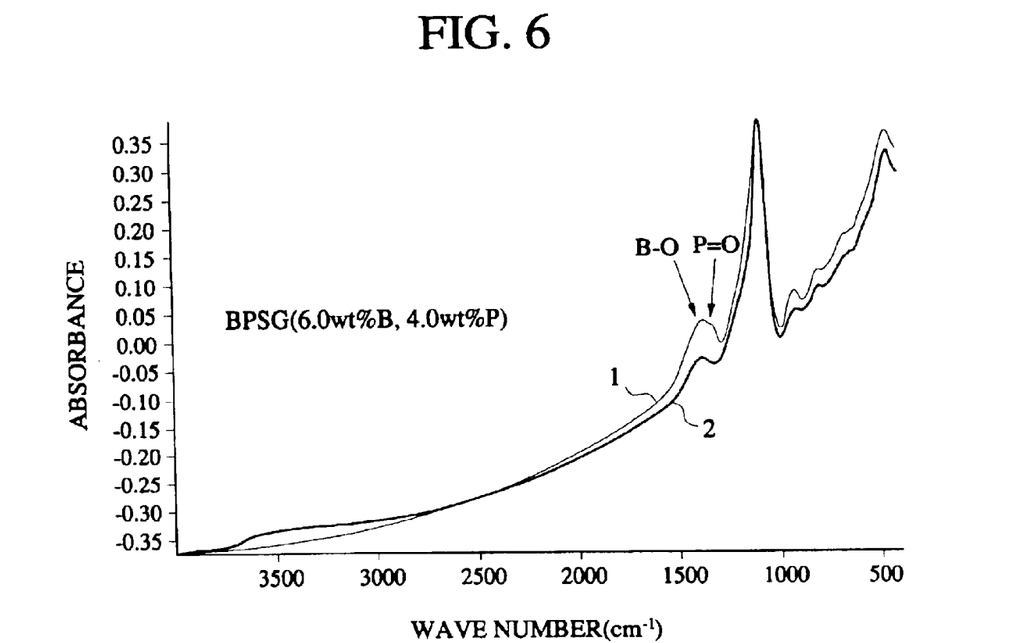
FIGS. 6 and 7 are graphs showing FTIR (Fourier Transform Infra-Red) measurement results of BPSG layers fabricated according to embodiments of the invention.

FIG. 6 is a graph showing FTIR measurement results of the as-deposited/reflowed BPSG layer and the cured BPSG layer according to the embodiment of the invention. Here, the as-deposited/reflowed BPSG layer was formed to have a boron concentration of 6 wt % and a phosphorus concentration of 4 wt %. Also, the as-deposited/reflowed BPSG layer was formed to a thickness of 4500 angstroms. In the graph of FIG. 6, the abscissa indicates wavelength, and the ordinate indicates optical absorbance of bonds that correspond to the respective wavelengths. Also, a curve 1 represents a FTIR measurement result of the as-deposited/reflowed BPSG layer, and a curve 2 represents a FTIR measurement result of the cured BPSG layer. The curing process applied to this experiment was performed under a humidity of 100%, a pressure of 2 atmospheres and a temperature of 121 degrees Celsius for 7 hours.

As shown in FIG. 6, B—O bonds and P=O bonds in the cured BPSG layer were substantially reduced as compared to those in the as-deposited/reflowed BPSG layer. The reduction of the B—O bonds and the P=O bonds denotes the generation of the pores.

Figure 7:
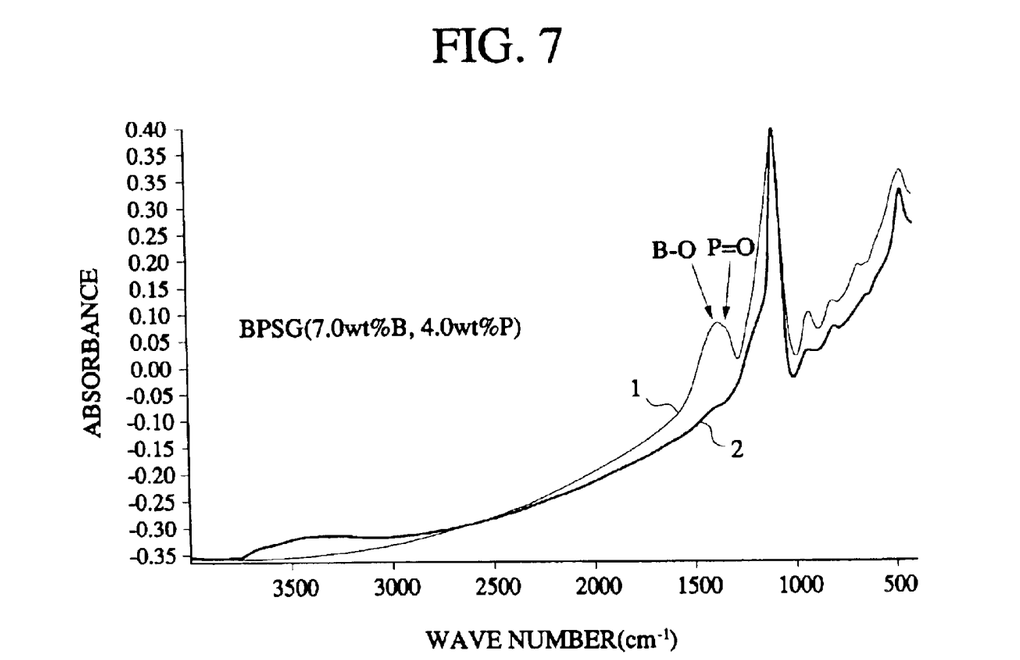

FIG. 7 is a graph showing the FTIR measurement results of another as-deposited/reflowed BPSG layer and the cured BPSG layer. Here, the as-deposited/reflowed BPSG layer was formed to have a boron concentration of 7 wt % and a phosphorus concentration of 4 wt %, and was formed to a thickness of 4500 angstroms. That is, only the boron concentration was increased.

Referring to FIGS. 6 and 7, peak points of the B—O bonds and the P=O bonds have completely disappeared when the boron concentration increases from 6 wt % to 7 wt %. As a result, the increase of the boron concentration had influence on the removal of phosphorus atoms as well as the removal of boron atoms.

Figure 8:
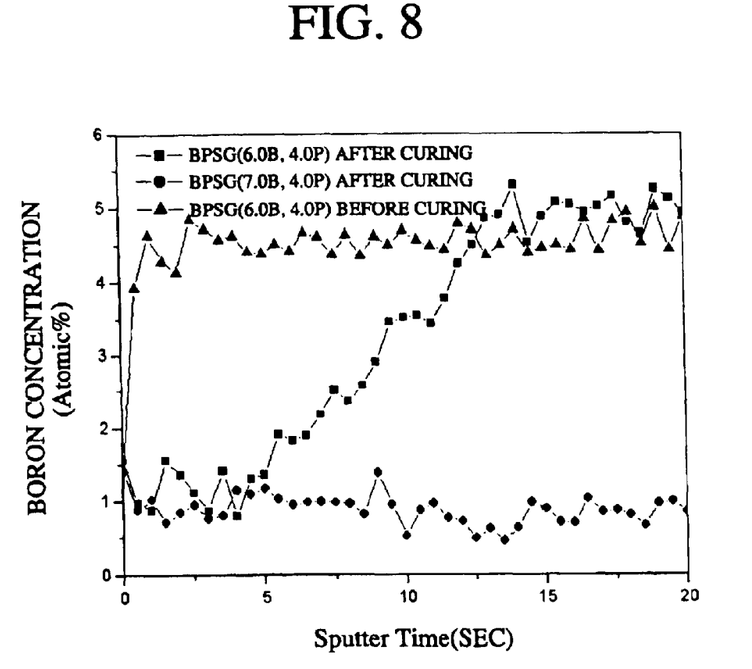
FIGS. 8 and 9 are graphs showing AES (Auger Electron Spectroscopy) measurement results of BPSG layers fabricated according to embodiments of the invention.
Figure 9:
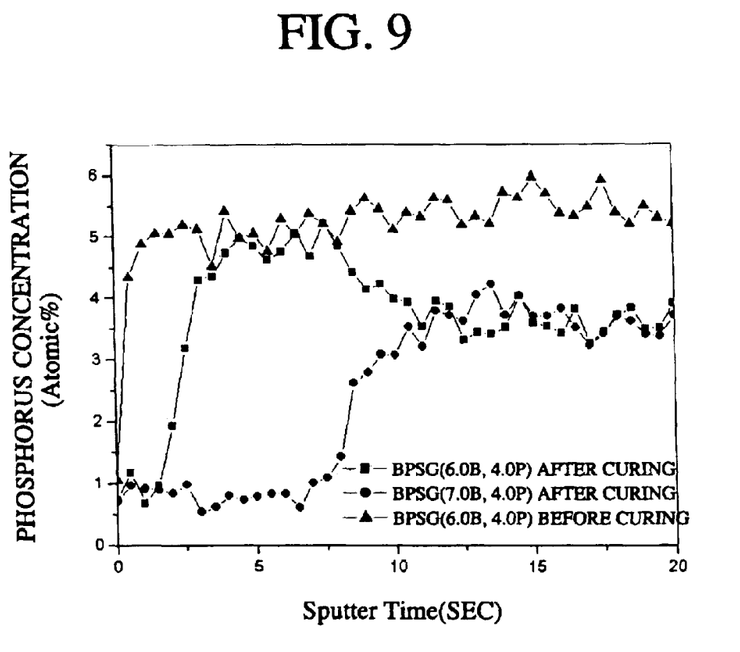

FIGS. 8 and 9 are graphs showing the AES (Auger Electron Spectroscopy) measurement results of BPSG layers having various impurity concentrations. In the graph of FIG. 8, the abscissa indicates a sputter etch time applied to the BPSG layers, and the ordinate indicates a boron concentration that corresponds to the respective sputter etch times. In the graph of FIG. 9, the abscissa indicates a sputter etch time applied to the BPSG layers, and the ordinate indicates a phosphorus concentration that corresponds to the respective sputter etch times. As the sputter etch time is increased, the depth of the measurement point also has been increased. Accordingly, FIGS. 8 and 9 exhibit the boron concentration and the phosphorus concentration in the bulk region of the BPSG layer. Here, the BPSG layers were formed in the same manner as explained in connection with FIGS. 6 and 7.

Referring to FIG. 8, after curing the BPSG layer having a boron concentration of 6 wt %, the porous region with a lack of boron atoms had a depth corresponding to the sputter etch time of 5 seconds to 13 seconds. On the contrary, after curing the BPSG layer having a boron concentration of 7 wt %, the porous region with a lack of boron atoms had a depth corresponding to the sputter etch time of at least 20 seconds. Thus, an increase of the boron concentration leads to a depth increase of the porous region.

Referring to FIG. 9, notwithstanding an increase of only the boron concentration in the as-deposited/reflowed BPSG layer, the depth of the porous region with a lack of phosphorus atoms was increased. Accordingly, it can be understood that the increase of the boron concentration in the as-deposited/reflowed BPSG layer leads to a reduction of the phosphorus concentration as well as a reduction of the boron concentration in the cured BPSG layer.

Figure 10:
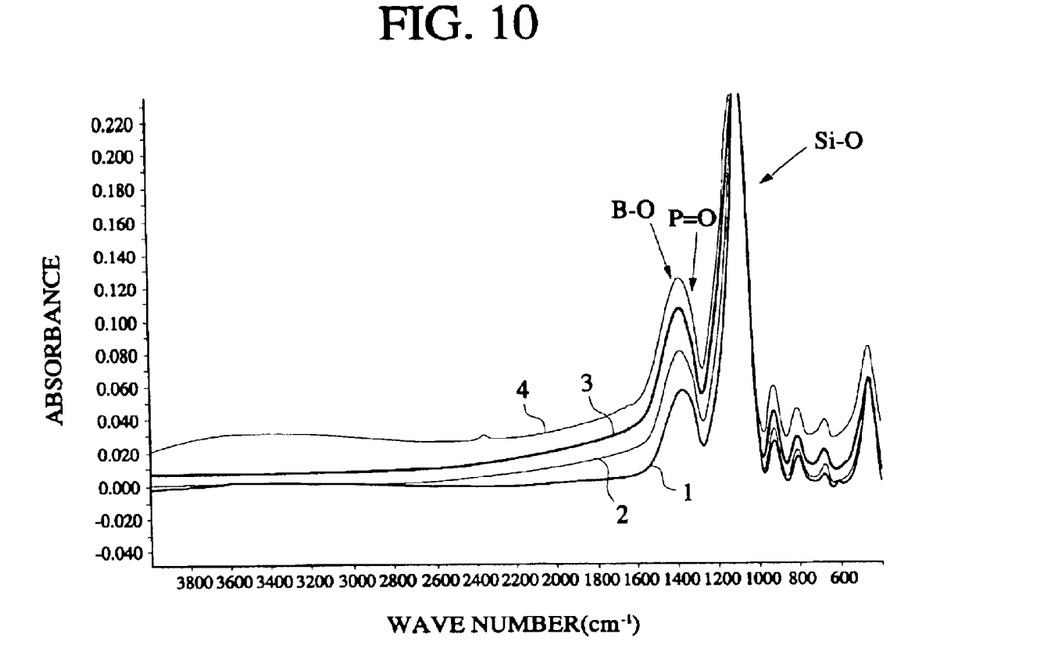
FIG. 10 is a graph showing FTIR measurement results of BPSG layers having various thicknesses prior to curing process.
Figure 11:
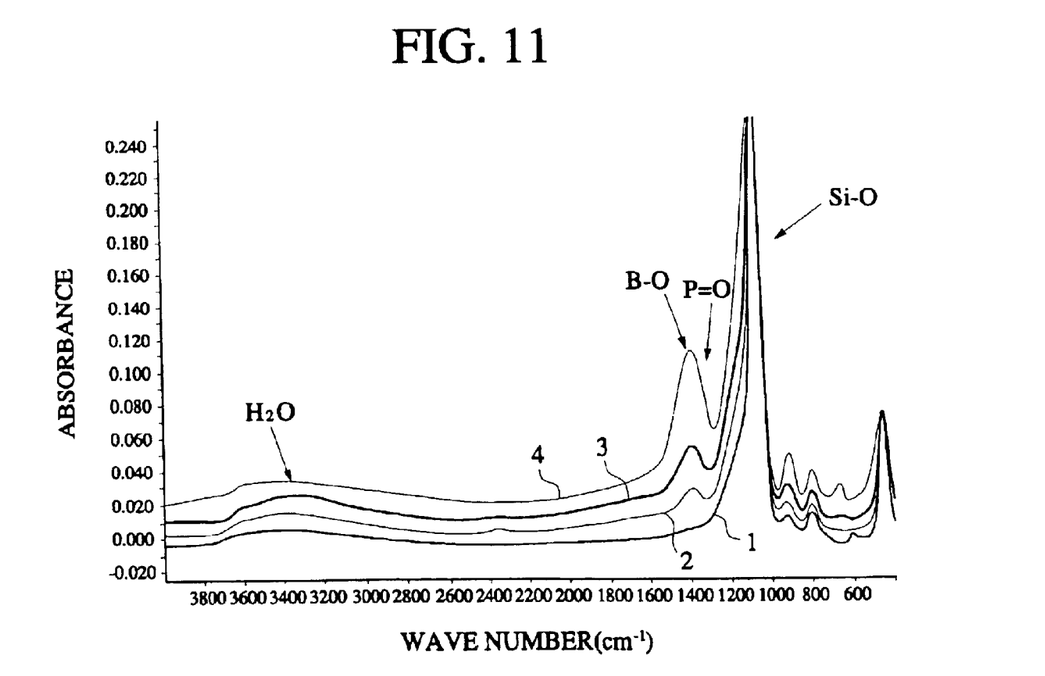
FIG. 11 is a graph showing FTIR measurement results of BPSG layers having various thicknesses after application of a curing process.

FIG. 10 is a graph showing the FTIR measurement results of as-deposited/reflowed BPSG layers having various thicknesses, and FIG. 11 is a graph showing the FTIR measurement results of cured BPSG layers. The as-deposited/reflowed BPSG layers were formed to have a boron concentration of 7 wt % and a phosphorus concentration of 4 wt %. Also, the curing process was performed under a humidity of 100%, a pressure of 2 atmospheres and a temperature of 121 degrees Celsius for 7 hours. In the graphs of FIGS. 10 and 11, the abscissa represents wavelength, and the ordinate represents optical absorbance of bonds that correspond to the respective wavelengths. Also, curves 1 to 4 are FTIR measurement results of BPSG layers having thicknesses of 2000 angstroms, 4000 angstroms, 6000 angstroms and 8000 angstroms, respectively.

As shown in FIGS. 10 and 11, the effect of the curing process is improved as the thickness of the as-deposited/reflowed BPSG layer is reduced. In detail, the BPSG layers having the thicknesses of 4000 angstroms, 6000 angstroms and 8000 angstroms exhibited peaks corresponding to the B—O bonds and the P=O bonds even after the curing process (refer to curves 2, 3 and 4 of FIG. 11). On the contrary, the BPSG layer having the thickness of 2000 angstroms does not exhibit any peaks corresponding to the B—O bonds and the P=O bonds after the curing process (refer to curve 1 of FIG. 11).

Figure 12:
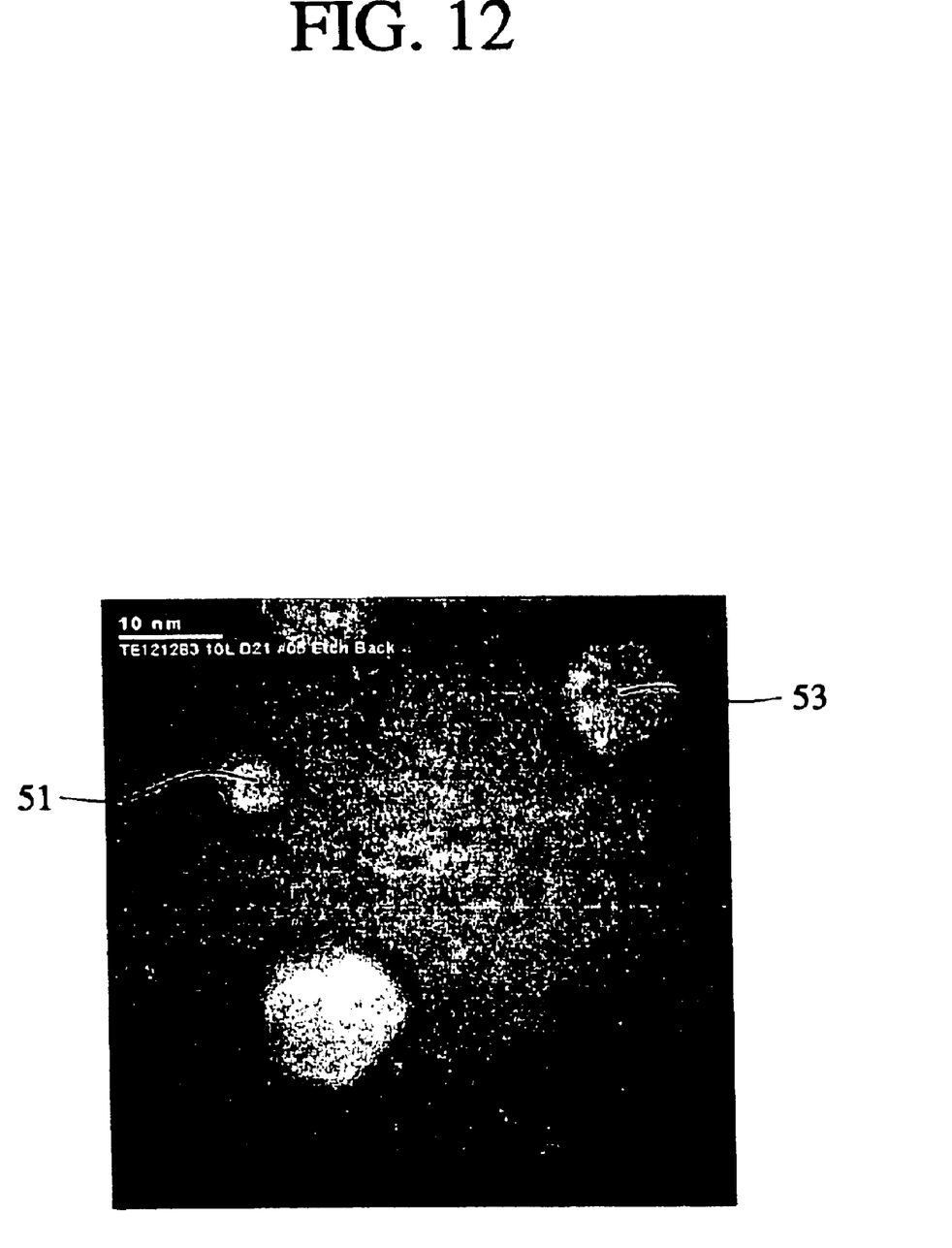
FIG. 12 is a TEM (Transmission Electron Microscope) picture showing pores in a porous BPSG layer fabricated according to an embodiment of the invention.

FIG. 12 is a TEM (Transmission Electron Microscope) picture showing pores in the porous BPSG layer fabricated according to the embodiments of the invention.

Referring to FIG. 12, a pore 51 is a void generated due to ejection of boron atoms, and a pore 53 is a void generated due to ejection of phosphorus atoms. A diameter of the pore 51 was about 30 angstrom to 50 angstrom, and a diameter of the pore 53 was about 100 angstrom to 150 angstrom.

According to the aforementioned embodiments, impurities in the material layer react with water molecules, and the impurities are ejected from the material layer. Thus, an inorganic porous insulating layer is formed. As a result, it is possible to form a reliable porous insulating layer having a low dielectric constant as well as etching and thermal immunity.

What is claimed is:

1. A method of forming a porous material layer, comprising:
   forming a material layer containing impurities on a substrate, wherein the impurities are reactive with water molecules; and
   heating the material layer under a pressure exceeding one atmosphere and in the presence of water vapor to generate pores in the material layer wherein the material layer is formed of at least one of borophosphosilicate (BPSG) glass, borosilicate glas (BSG), phosphosilicate glass, fluorinated BPSG, and fluorinated BSG, and wherein the impurities are at least one of borone atoms and phosphorus atoms.

2. The method of claim 1, wherein the material layer is an insulating layer.

3. The method of claim 2, wherein the material layer is inorganic.

4. The method of claim 2, wherein the insulating layer is formed of at least one of borophosphosilicate (BPSG) glass, borosilicate glass (BSG), phosphosilicate glass, fluorinated BPSG, and fluorinated BSG, and wherein the impurities are at least one of boron atoms and phosphorus atoms.

5. The method of claim 1, wherein said heating the material layer comprises heating the substrate to a temperature in the range of 85 degrees Celsius to 150 degrees Celsius.

6. The method of claim 1, wherein a humidity of the water vapor is 85% to 100%.

7. The method of claim 1, wherein the pressure is 2 atmospheres to atmospheres.

8. The method of claim 1, wherein the pores are formed by ejection of the impurities that react on the water molecules of the water vapor.

9. The method of claim 1, further comprising, after forming the pores, baking the material layer to remove water that exists in the material layer.

10. The method of claim 9, wherein said baking is performed using a hydrogen gas and a nitrogen gas as ambient gases and by heating the substrate to a temperature of 350 degrees Celsius to 400 degrees Celsius.

11. The method of claim 9, further comprising irradiating the baked material layer with ultraviolet rays to remove any silanol groups existing in the baked material layer.

12. A method of fabricating a semiconductor device comprising:
    forming an interlayer insulating layer on a semiconductor substrate, the interlayer insulating layer containing impurities that are reactive with water molecules;
    loading the substrate having the interlayer insulating layer into a chamber;
    introducing pressurized water vapor into the chamber and simultaneously heating the substrate to generate pores in the interlayer insulating layer;
    baking the interlayer insulating layer having the pores using a hydrogen gas and a nitrogen gas as ambient gases to remove water that exists in the interlayer insulating layer; and
    forming metal interconnection lines using a dual damascene process in the baked interlayer insulating layer wherein the interlayer insulating layer is formed of at least one of borophosphosilicate (BPSG) glass, borosilicate glass (BSG), phosphosilicate glass, fluorinated BPSG, and fluorinated BSG.

13. The method of claim 12, wherein the interlayer insulating layer is inorganic.

14. The method of claim 12, wherein the interlayer insulating layer is formed of at least one of borophosphosilicate (BPSG) glass, borosilicate glass (BSG), phosphosilicate glass, fluorinated BPSG, and fluorinated BSG.

15. The method of claim 12, wherein a humidity of the water vapor is 85% to 100%.

16. The method of claim 12, wherein the water vapor is pressurized in the range of 2 atmospheres to 5 atmospheres.

17. The method of claim 12, wherein the substrate is heated to a temperature of 85 degrees Celsius to 150 degrees Celsius during the generation of pores.

18. The method of claim 12, wherein the pores are formed by ejection of the impurities that react on the water molecules of the water vapor.

19. The method of claim 12, further comprising, prior to formation of the metal interconnection lines, irradiating the baked interlayer insulating layer with ultraviolet rays to remove silanol groups that exists in the baked interlayer insulating layer.

20. The method of claim 12, wherein the metal interconnection lines are formed of copper.

* * * * *